United States Patent
Hong

(10) Patent No.: US 9,236,296 B2
(45) Date of Patent: Jan. 12, 2016

(54) FABRICATION METHOD FOR MIM CAPACITOR

(71) Applicant: Semiconductor Manufacturing International (Shanghai) Corporation, Shanghai (CN)

(72) Inventor: Zhongshan Hong, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 108 days.

(21) Appl. No.: 14/037,348

(22) Filed: Sep. 25, 2013

(65) Prior Publication Data

US 2014/0145302 A1    May 29, 2014

(30) Foreign Application Priority Data

Nov. 27, 2012  (CN) .......................... 2012 1 0492190

(51) Int. Cl.

| H01L 21/00 | (2006.01) |
|---|---|
| H01L 21/768 | (2006.01) |
| H01L 49/02 | (2006.01) |
| H01L 21/762 | (2006.01) |
| H01L 23/522 | (2006.01) |

(52) U.S. Cl.
CPC .... *H01L 21/76877* (2013.01); *H01L 21/76224* (2013.01); *H01L 23/5223* (2013.01); *H01L 28/75* (2013.01); *H01L 28/90* (2013.01); *H01L 2924/0002* (2013.01)

(58) Field of Classification Search
CPC ..................... H01L 27/10852; H01L 27/1087; H01L 29/945; H01L 28/75; H01L 21/76802; H01L 21/76224; H01L 21/76877; H01L 21/28132; H01L 21/02071; H01L 21/02074; H01L 1/28273; H01L 21/76834; H01L 21/76841; H01L 21/7687; H01L 23/5223; H01L 28/90; H01L 2924/0002
USPC ......... 438/386, 381, 396, 243, 700, 239, 253, 438/387, 397
See application file for complete search history.

(56) References Cited

U.S. PATENT DOCUMENTS

| 6,720,232 B1* | 4/2004 | Tu et al. ........................ 438/396 |
|---|---|---|
| 7,442,979 B2* | 10/2008 | Shea ............................ 257/298 |
| 2005/0191820 A1* | 9/2005 | Tu et al. ....................... 438/396 |
| 2007/0096319 A1* | 5/2007 | Hsu et al. ..................... 257/750 |
| 2008/0290459 A1 | 11/2008 | Barth et al. |

* cited by examiner

*Primary Examiner* — Shouxiang Hu
(74) *Attorney, Agent, or Firm* — Anova Law Group, PLLC

(57) ABSTRACT

Various embodiments provide an MIM capacitor and fabrication method thereof. An exemplary MIM capacitor can include a dielectric layer disposed over a substrate containing a conductive layer. The dielectric layer can include a groove to expose the conductive layer in the substrate. A first metal layer can be disposed on a bottom surface and a bottom portion of a sidewall surface of the groove. A top surface of the first metal layer on the sidewall surface of the groove can be lower than a top surface of the dielectric layer. A dielectric material layer can be disposed on the first metal layer and on a top portion of the sidewall surface of the groove. A second metal layer can be disposed on the dielectric material layer; and a third metal layer can be disposed on the second metal layer to fill the groove.

15 Claims, 7 Drawing Sheets

FABRICATION METHOD FOR MIM CAPACITOR

CROSS-REFERENCES TO RELATED APPLICATIONS

This application claims priority to Chinese Patent Application No. CN201210492190.4, filed on Nov. 27, 2012, the entire contents of which are incorporated herein by reference.

FIELD OF THE DISCLOSURE

The present disclosure relates to the field of semiconductor technology and, more particularly, relates to MIM capacitors and methods for forming the same.

BACKGROUND

Capacitor components are often used as passive electronic devices in integrated circuits (IC) such as radio frequency IC, monolithic microwave IC, etc. Common capacitor components include metal-oxide-semiconductor (MOS) capacitors, PN junction capacitors and MIM (metal-insulator-metal) capacitors. In some specific applications, MIM capacitors provide better electrical characteristics than MOS capacitors and PN junction capacitors. MOS capacitors and PN junction capacitors may be limited by their structures, and vacancy layers can be easily formed at the electrodes during operation. This may cause reduction of frequency characteristics. In contrast, MIM capacitors can provide better frequency and temperature characteristics. In semiconductor manufacturing, MIM capacitors can be formed by interlayer metal and copper interconnect processes, which reduces difficulties and complexities for integration in CMOS front-end processes.

FIG. 1 depicts an MIM capacitor made by a conventional CMOS IC manufacturing process. The MIM capacitor includes a substrate 100, a conductive layer 103 disposed within the substrate 100, and a dielectric layer 101 disposed on the substrate 100. The dielectric layer 101 has an opening exposing the surface of the conductive layer 103. The MIM capacitor further includes a first metal layer 103, an insulating layer 104, and a second metal layer 105. The first metal layer 103 is formed on the bottom and sidewall of the opening and serves as a first electrode plate of the MIM capacitor. The insulating layer 104 is formed on the surface of the first metal layer 103 and serves as a dielectric layer of the MIM capacitor. The second metal layer 105 is formed on the surface of the insulating layer 104 to fill the opening. The second metal layer 105 serves as a second electrode plate of the MIM capacitor.

During operation of the MIM capacitor, operating voltages are applied only to the conductive layer 103 and the second metal layer 105. However, such MIM capacitor is prone to leakage current during operation, which affects the stability of MIM capacitors.

BRIEF SUMMARY OF THE DISCLOSURE

According to various embodiments, there is provided a method for forming an MIM capacitor by first forming a dielectric layer over a substrate containing a conductive layer. A groove can be formed through the dielectric layer to expose the conductive layer in the substrate. A first metal layer can be formed on a sidewall surface and a bottom surface of the groove and on a top surface of the dielectric layer. A sacrificial layer can be formed in the groove to expose a portion of the first metal layer that is on the top surface of the dielectric layer and on a top portion of the sidewall surface of the groove. The exposed portion of the first metal layer can be removed to leave a remaining portion in the groove as a first electrode plate of the MIM capacitor. The sacrificial layer can be removed from the groove to expose the first electrode plate. A dielectric material layer can be formed on the first electrode plate, on the top portion of the sidewall surface of the groove, and on the top surface of the dielectric layer. A second metal layer can be formed on the dielectric material layer and a third metal layer can be formed on the second metal layer to fill the groove in the dielectric layer. The third metal layer, the second metal layer, and the dielectric material layer can then be polished using the top surface of the dielectric layer as a stop layer.

According to various embodiments, there is also provided an MIM capacitor. An exemplary MIM capacitor includes a dielectric layer disposed over a substrate containing a conductive layer. The dielectric layer can include a groove to expose the conductive layer in the substrate. A first metal layer can be disposed on a bottom surface and a bottom portion of a sidewall surface of the groove and can be used as a first electrode plate of the MIM capacitor. A top surface of the first metal layer on the sidewall surface of the groove can be lower than a top surface of the dielectric layer. A dielectric material layer can be disposed on the first metal layer and on a top portion of the sidewall surface of the groove. The dielectric material layer can serve as a dielectric layer of the MIM capacitor. A second metal layer can be disposed on the dielectric material layer; and a third metal layer can be disposed on the second metal layer to fill the groove. The second metal layer and the third metal layer can serve as a second electrode plate of the MIM capacitor.

Other aspects or embodiments of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts. In reference to the exemplary embodiments of the disclosure, for the clarity of description, the schematic drawings may be partially enlarged and may not to scale. The schematic drawings are for illustration purposes, and should not limit the scope of the present disclosure. In addition, three-dimensional scales of length, width and depth should be included in practical fabrication process.

Figure 1:
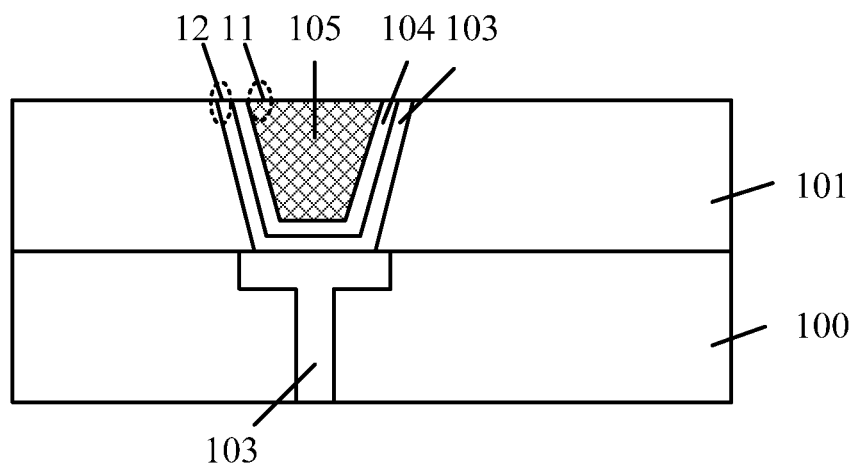
FIG. 1 depicts a cross-sectional view of a conventional MIM capacitor.

Referring to FIG. 1, in a conventional CMOS integration process, the process of fabricating the first metal layer 103, the insulating layer 104, and the second metal layer 105 of the MIM capacitor includes: forming a first metal film on the sidewall and the bottom surface of the opening and on the surface of the dielectric layer; forming an insulating film on the first metal film; and forming a second metal film on the insulating film to fill the opening. A chemical mechanical polishing is performed to the second metal film, the insulating film, and the first metal film, using the surface of the dielectric layer 101 as stop layer, to form the first metal layer 103, the insulating layer 104 on the first metal layer 103, and the second metal layer 105 on the insulating layer 104, as shown in FIG. 1.

In this case, the top surface 12 of the first metal layer 103 and the top surface 11 of the second metal layer 105 are leveled with each other in the same plane. The insulating layer 104 is a thin layer between the first metal layer 103 and the second metal 105. The top surface 12 of the first metal layer 103 and the top surface 11 of the second metal layer 105 are sufficiently close in distance. Therefore, when operating voltages are applied to the conductive layer 103 and the second metal layer 105, leakage current can be easily generated between the top surface 12 of the first metal layer 103 and the top surface 11 of the second metal layer 105. This causes electrical conduction between the two electrode plates of the MIM capacitor and affects the stability of the MIM capacitor.

As disclosed herein, an MIM capacitor and fabrication method are provided. For example, after a first metal layer is formed on sidewall and bottom surfaces of a groove and on the surface of a dielectric layer, a portion of the first metal layer on the sidewall of the groove can be removed by etch-back. The remaining portion of the first metal layer can serve as the first electrode plate of the MIM capacitor. A dielectric material layer can be formed on the first electrode plate, the dielectric layer, and a portion of the sidewall of the groove. Further, a second metal layer can be formed on the dielectric material layer. A third metal layer can be formed on the second metal layer to fill the groove. The third metal layer, the second metal layer, and the dielectric material layer can be chemical mechanical polished, using the surface of the dielectric layer as a stop layer. The part of the third metal layer and the second metal layer remaining in the groove can serve as the second electrode plate of the MIM capacitor. The part of the dielectric material layer remaining in the groove can serve as the dielectric layer of the MIM capacitor.

In this manner, the top surface of the first electrode plate on the sidewall of the groove can be lower than the top surface of the dielectric layer. And the surface of the second metal layer and the third metal layer can be leveled with the surface of the dielectric layer. That is, the top surface of the first electrode plate on the sidewall of the groove can be lower than the surface of the second electrode plate (e.g., formed by the second metal layer and the third metal layer). The distance between the top of the first electrode plate and the top of the second electrode plate can thus be increased. When the MIM capacitor is in operation, the leakage current generated between the first electrode plate and the second electrode plate can be reduced. Or the possibility of generating leakage current between the first electrode plate and the second electrode plate can be reduced. The stability of the MIM capacitor can be improved.

Figure 10:
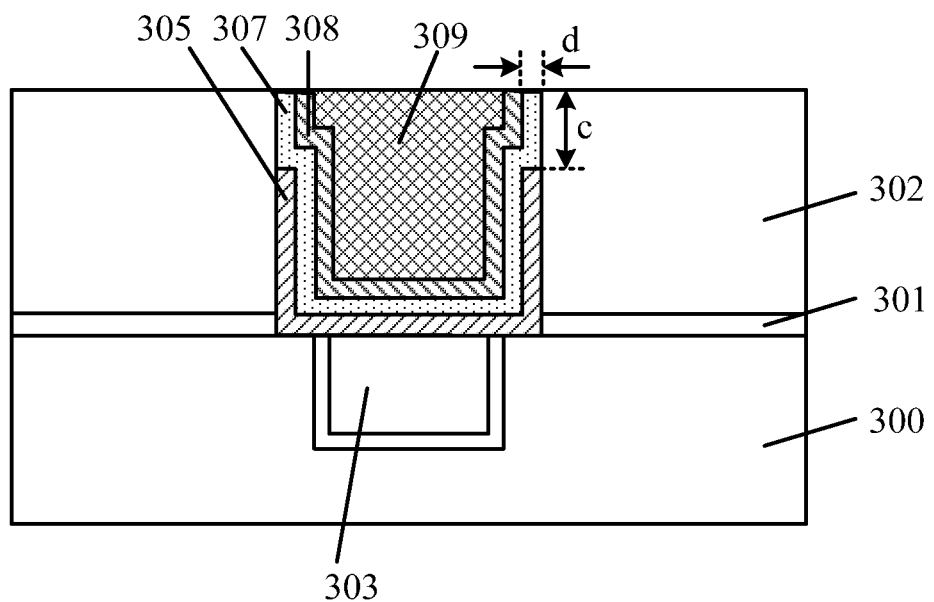
Figure 11:
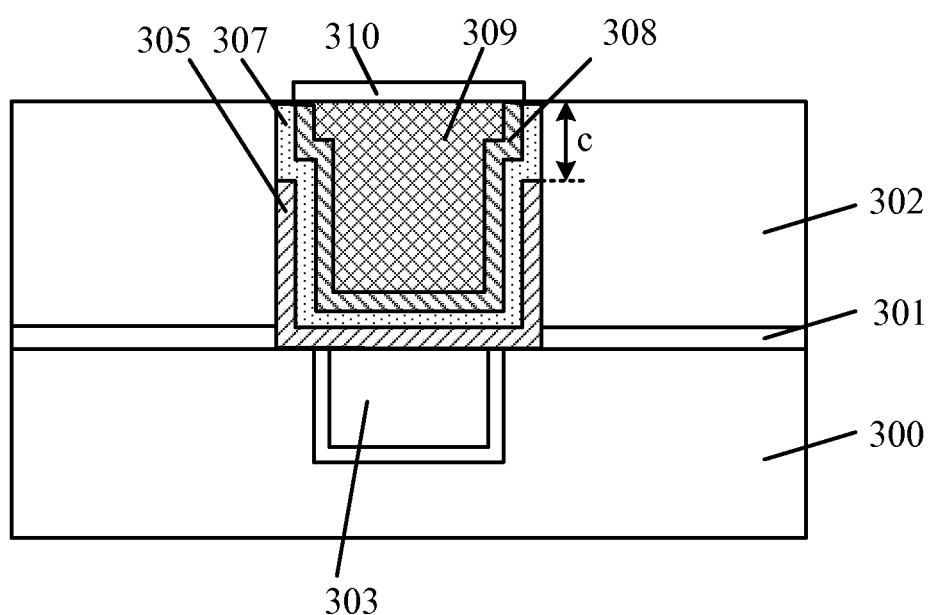
Figure 12:
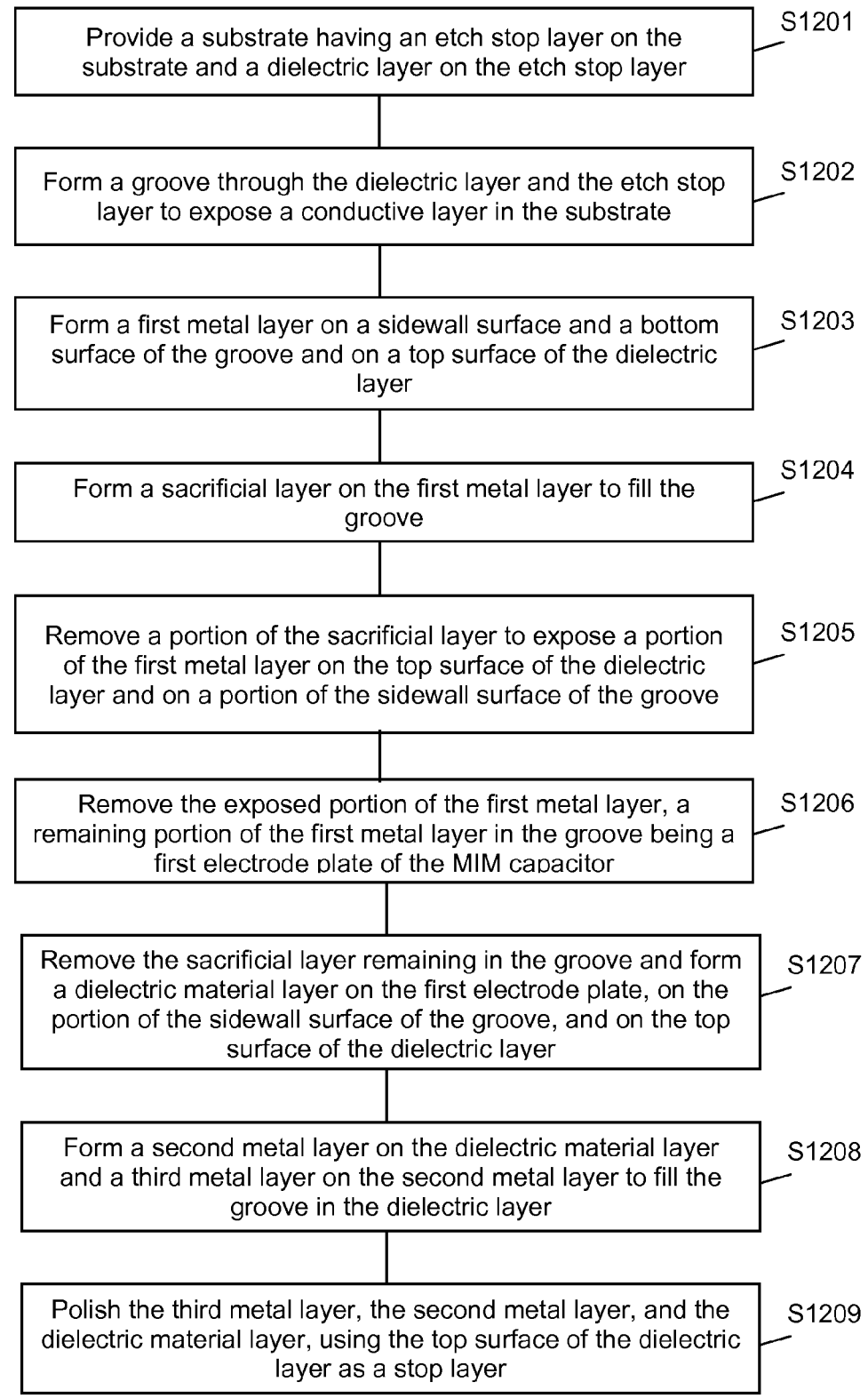
FIG. 12 depicts an exemplary method for forming an MIM capacitor in accordance with various disclosed embodiments.

FIG. 12 depicts an exemplary method for forming an MIM capacitor, while FIGS. 2-11 depict cross-sectional views of corresponding structures of an exemplary MIM capacitor at various stages during its formation in accordance with various disclosed embodiments. Note that although FIGS. 2-11 depict semiconductor structures corresponding to the method depicted in FIG. 12, the semiconductor structures and the method are not limited to one another in any manner.

Figure 2:
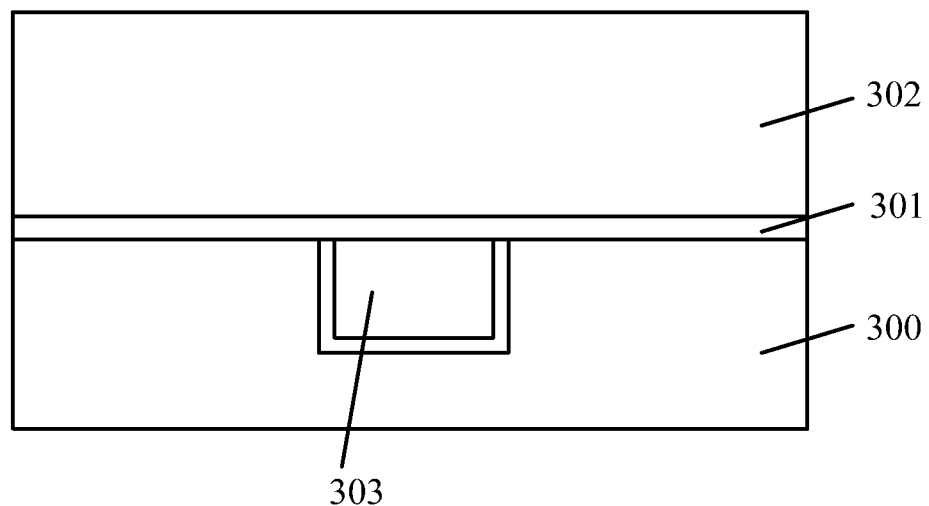
FIGS. 2-11 depict cross-sectional views of an exemplary MIM capacitor at various stages during its formation in accordance with various disclosed embodiments.

In Step S1201 of FIG. 12 and referring to FIG. 2, a substrate 300 is provided having a conductive layer 303 formed within the substrate 300. An etch stop layer 301 is formed on the 300 substrate. A dielectric layer 302 is formed on the etch stop layer 301.

The substrate 300 can be a single-layer structure. Materials for forming the substrate 300 can include, for example, silicon oxide, silicon nitride, a low-K dielectric material, and/or an ultra-low-K dielectric material. The conductive layer 303 formed in the substrate 300 can be used to apply an operating voltage to the first electrode plate of the MIM capacitor.

Alternatively, the substrate 300 can be a multi-layer structure. The multi-layer structure can include a semiconductor substrate and at least one interlayer dielectric layer disposed on the semiconductor substrate. The semiconductor substrate can be single crystal silicon (Si), single crystal germanium (Ge), silicon germanium (GeSi), and/or silicon carbide (SiC). The semiconductor substrate can also be silicon-on-insulator (SOI), germanium-on-insulator (GOI), and/or Group III-V compound(s) including, e.g., GaAs. Semiconductor devices such as MOS transistors may be formed within the semiconductor substrate. The conductive layer 303 can be located within the interlayer dielectric layer of the multi-layer structure of the substrate 300. Passive devices, e.g., inductors, capacitors, and or other suitable devices, can be formed within the interlayer dielectric layer. In some embodiments, the conductive layer 303 can be electrically connected to the semiconductor devices and/or the passive devices.

The conductive layer 303 can include a dual-damascene structure. The conductive layer 303 can be made of copper, aluminum, and/or other suitable conductive materials. A diffusion barrier layer can be formed between the conductive layer 303 and the substrate 300 to prevent the metal material in the conductive layer 303 from diffusing into the substrate 300 and affecting the insulating property of the substrate 300. The etch stop layer 301 can be silicon nitride. The dielectric layer 302 can be silicon oxide, a low-K dielectric material or an ultra-low-K dielectric material.

Figure 3:
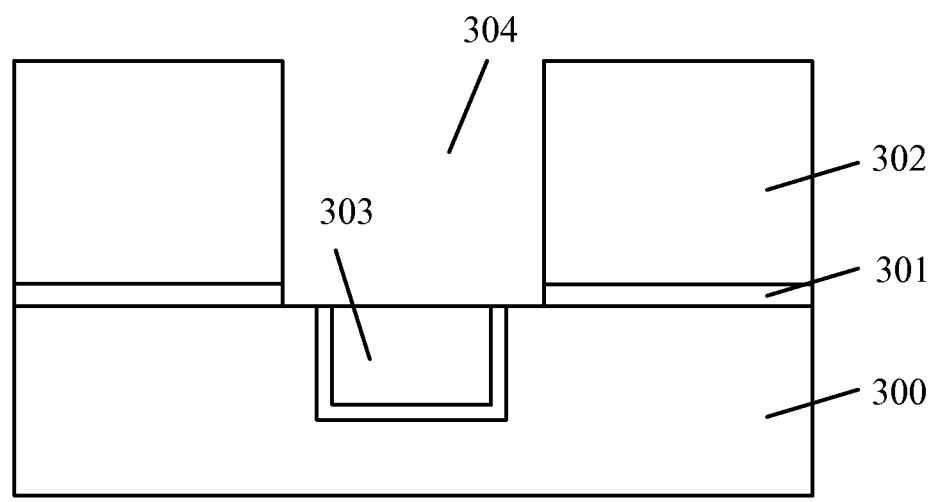

In Step S1202 of FIG. 12 and referring to FIG. 3, the dielectric layer 302 and the etch stop layer 301 are etched to form a groove 304 through the dielectric layer 302 and the etch stop layer 301 to expose the conductive layer 303.

The groove 304 can be used to subsequently form the MIM capacitor. The process of forming the groove 304 can include, for example, forming a mask layer on the dielectric layer 302. The mask layer can have a through-opening exposing the dielectric layer 302 and can be used as an etch mask to etch the dielectric layer 302 and the etch stop layer 301 by, e.g., a plasma etching process, to form the groove 304.

In one embodiment, the sidewall of the groove 304 can be perpendicular to the surface of the substrate 300. The depth of the groove 304 can range from about 1000 angstroms to about 10000 angstroms.

In other embodiments, the sidewall of the groove 304 can form a slope (not shown) with the surface of the substrate 300. For example, the width of the groove 304 can gradually decrease in a direction from the top surface to the bottom surface of the dielectric layer 302. Thus, when the first metal layer, the dielectric material layer and the second metal layer are subsequently formed by deposition, the formation of protuberance defects at the opening of the groove 304 can be prevented. In various embodiments, the bottom width of the groove 304 can be greater than or smaller than or equal to the width of the conductive layer 303.

Figure 4:
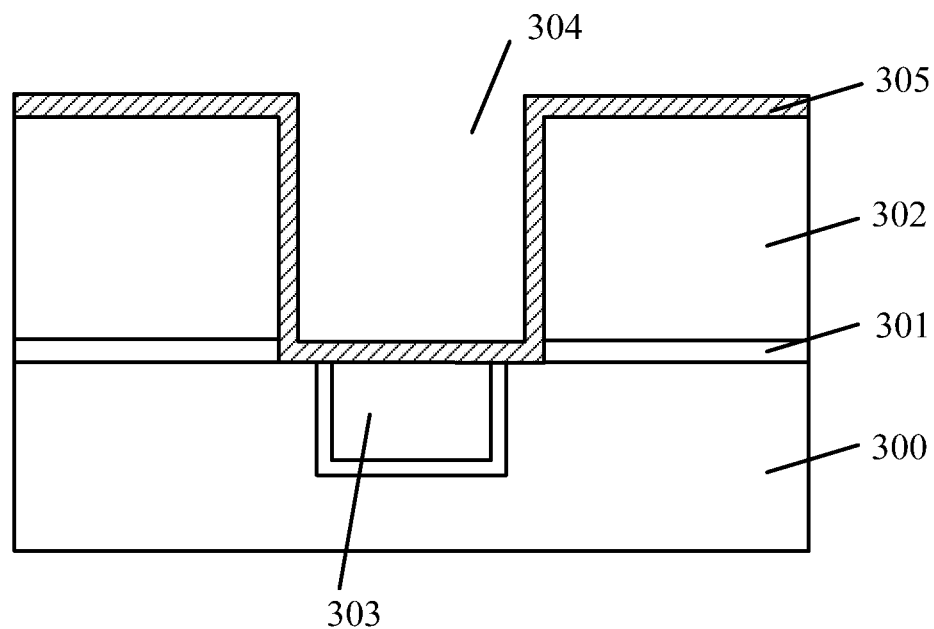

In Step S1203 of FIG. 12 and referring to FIG. 4, a first metal layer 305 is formed on the sidewall and the bottom surface of the groove 304 and on the surface of the dielectric layer 302.

The first metal layer 305 can be used to form the first electrode plate of the MIM capacitor. The first metal layer 305 can be a metal alloy or metal with low electrical resistivity.

In some embodiments, the material of the first metal layer 305 can include one or more of Ti, Ta, Ru, TiN, and TaN. The process of forming the first metal layer 305 can include a physical vapor deposition or a chemical vapor deposition. The first metal layer 305 can be connected to the conductive layer 303. The first metal layer 305 can serve as the first electrode plate of the MIM capacitor can also be a diffusion barrier layer of conductive layer 303 to prevent the metal of the conductive layer 303 from diffusing into a dielectric material layer that is subsequently formed on the first metal layer 305. Thus, the dielectric constant of the dielectric material layer can be intact, and the capacitance of the MIM capacitor can be maintained stable.

Figure 5:
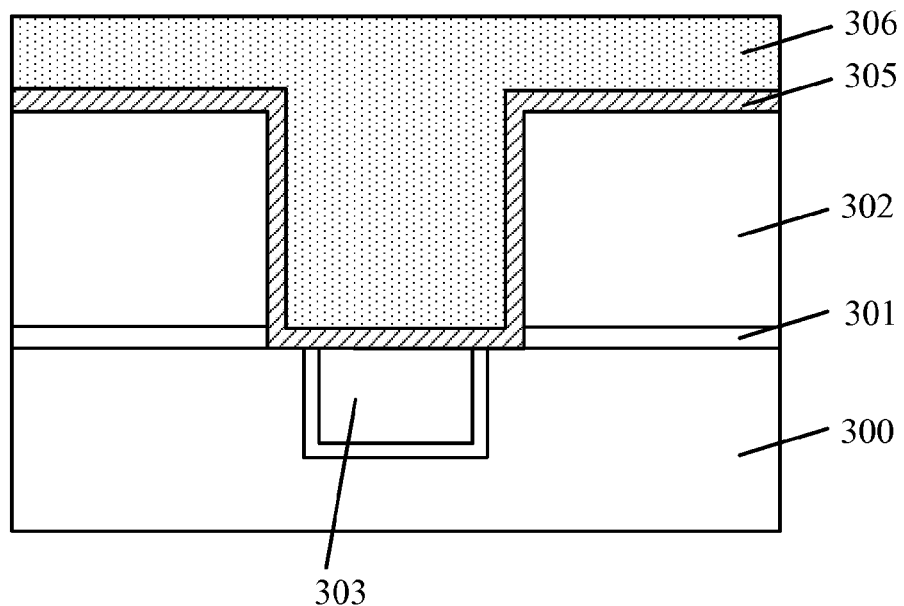

In Step S1204 of FIG. 12 and referring to FIG. 5, a sacrificial material layer 306 is formed on the first metal layer 305 and fills the groove 304.

The sacrificial material layer 306 can be used to define the removal thickness of the first metal layer 305. When a portion of the first metal layer 305 is removed, the sacrificial material layer 306 can also be used as a protective layer to protect the remaining portion of the first metal layer 305 in the groove.

The material of the sacrificial material layer 306 can be, e.g., a bottom anti-reflective coating, amorphous carbon, polymer, amorphous silicon or polysilicon, and/or other suitable materials. Using such materials can provide advantages including, for example, ease of formation and removal and having low cost. In addition, when the sacrificial layer is removed, the sacrificial material layer 306 can have a high etching selection ratio over the first metal layer 305 and/or the dielectric layer 302.

In one embodiment, the sacrificial material layer 306 can be a bottom anti-reflective coating. Bottom anti-reflective coating has desired hole-filling capability and simple formation/removal processes. For example, the bottom anti-reflective coating can be formed by spin-coating.

Figure 6:
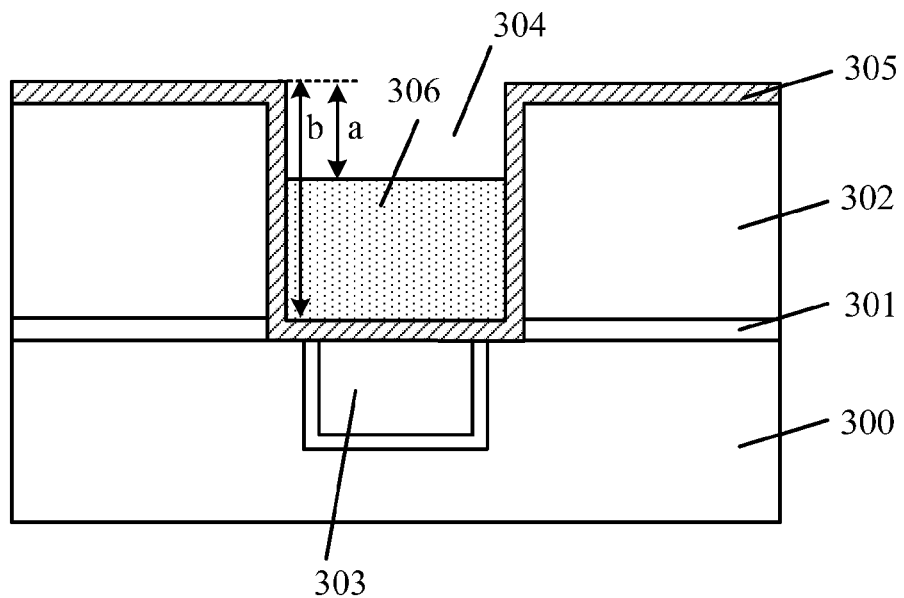

In Step S1205 of FIG. 12 and referring to FIG. 6, a first portion of the sacrificial material layer 306 on the surface of the dielectric layer 302 (shown in FIG. 5) and a bottom portion of the sacrificial material layer 306 (or a sacrificial layer 306) in the groove 304 is removed, e.g., by an etch-back process. The first metal layer 305 on the dielectric layer 302 and a top portion of the first metal layer 305 in the groove 304 can thus be exposed, as shown in FIG. 6.

When the sacrificial layer 306 is a carbon-based material, such as a bottom anti-reflective coating, amorphous carbon, or polymer, the top portion of the sacrificial material layer 306 can be removed, e.g., etched back, using oxygen-based plasma etching, e.g., having a bias power of plasma of less than about 200 Watts. When the sacrificial layer 306 is made of polysilicon or amorphous silicon, the plasma etching can use halogen gases (e.g., CF, $SF_6$, and/or $Cl_2$) and a bias power of less than about 200 watts. In other embodiments, the sacrificial material layer 306 can be etched back using a wet etching process.

Figure 7:
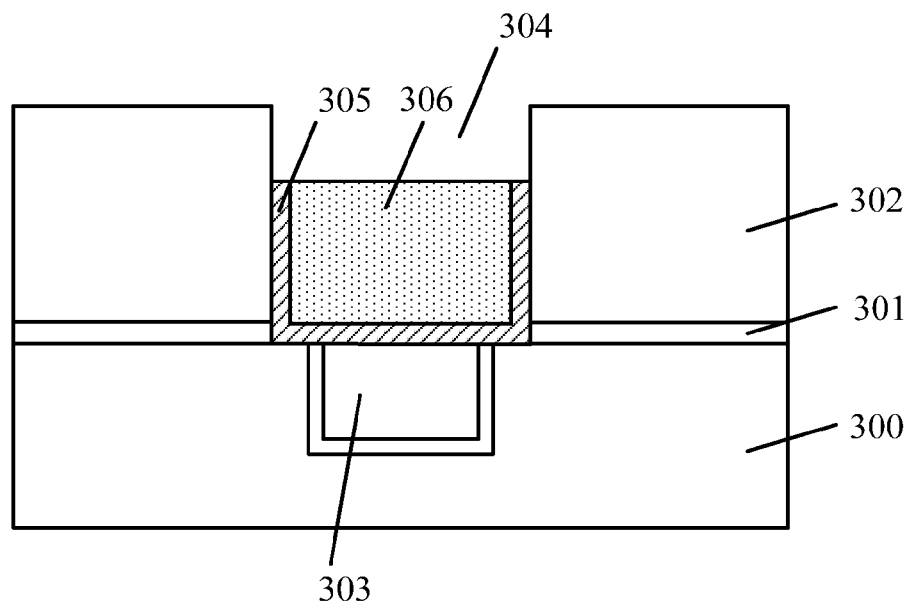

After removing the top portion of the sacrificial layer 306 from the groove 304, the portion of the first metal layer 305 on the dielectric layer 302 and a top portion of the first metal layer 305 in the groove 304 can be subsequently removed (e.g., as shown in FIG. 7). The top surface of the etched first metal layer (e.g., to form a first electrode plate) remaining on the sidewall of the groove 304 can be distanced from the top surface of the dielectric layer 302. Subsequently, when the dielectric layer of the MIM capacitor is formed on the etched first metal layer remaining on the sidewall of the groove and on a portion of the sidewall of the groove, and when the second electrode plate is formed on the dielectric layer, the top surfaces of the first and second electrode plates are no longer in the same plane. The distance between the top surfaces of the first and second electrode plates can thus be increased. When the MIM capacitor is in operation, the leakage current generated between the first electrode plate and the second electrode plate can be reduced. Or, the possibility of generating leakage current between the first and second electrode plates can be reduced. Thereby operating stability of the MIM capacitor can be improved. In addition, there can be no increase in design dimension of the formed MIM capacitor, comparing with the design dimension of conventional MIM capacitors.

The ratio of the etch-back thickness a of the sacrificial layer 306 in the groove 304 relative to the entire depth b of the groove 304 can range from about 5% to about 30%. Thus, the distance can reach optimal between the top surfaces of the subsequently-formed first and second electrode plates, while the leakage current between the first and second electrode plates can reach minimum. Furthermore, areas of the first and second electrode plates that face against each other can be less reduced to provide the MIM capacitor with less reduced capacitance. In some embodiments, the etch-back thickness a of the sacrificial layer 306 in the groove 304 can range from about 100 angstroms to about 2000 angstroms.

In Step S1206 of FIG. 12 and referring to FIG. 7, an exposed portion of the first metal layer 305 can be removed from the dielectric layer 302 and from the sidewall of the groove 304 (shown in FIG. 6) by an etching process. The etching process can include, a plasma etching using halogen gases (e.g., $Cl_2$) with a plasma bias power of less than about 200 watts. Alternatively, the etching process can include a wet etching process that contains HCl or $H_2O_2$. The first metal layer 305 remaining in the groove 304 can serve as the first electrode plate of the MIM capacitor.

Figure 8:
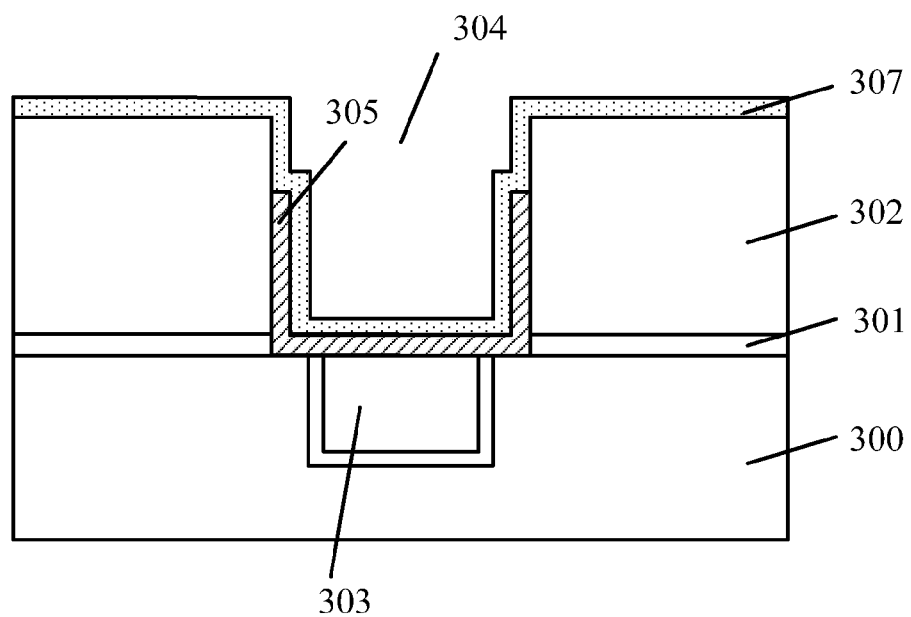

In Step S1207 of FIG. 12 and referring to FIG. 8, the sacrificial layer 306 remaining in the groove 304 (shown in FIG. 7) is removed, followed by formation of a dielectric material layer 307 on the first metal layer 305 remaining in the groove 304 and on the dielectric layer 302 (including the exposed portion of the sidewall of the groove 304). In one example, the dielectric material layer 307 can be conformally formed.

The dielectric material layer 307 can be used for forming the dielectric layer of the MIM capacitor. The dielectric material layer 307 can have a dielectric constant ranging from about 5 to about 200, and a thickness ranging from about 10 angstroms to about 200 angstroms. The dielectric material layer 307 can be a high-K dielectric material. The high-K dielectric material can include, for example, $HfO_2$, $TiO_2$, HfZrO, HfSiNO, $Ta_2O_5$, $ZrO_2$, $ZrSiO_2$, $Al_2O_3$, $SrTiO_3$ and/or BaSrTiO.

Figure 9:
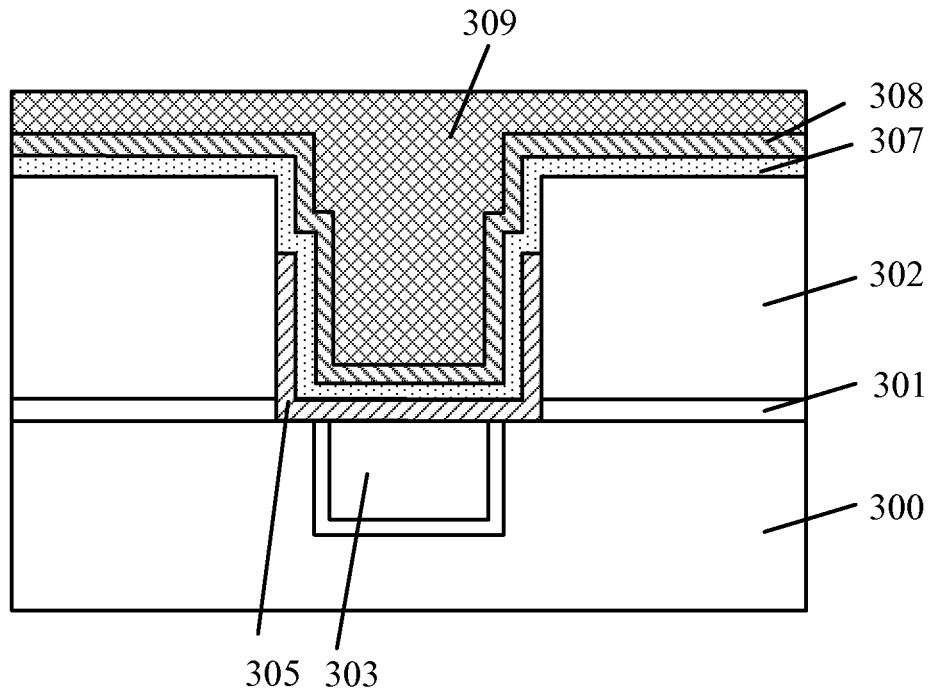

In Step S1208 of FIG. 12 and referring to FIG. 9, a second metal layer 308 is formed on the surface of the dielectric material layer 307. A third metal layer 309 is formed on the second metal layer 308 and fills the groove.

The second metal layer 308 and the first metal layer 305 can be of the same or different material. The material of the second metal layer 308 can be one or more of Ti, Ta, Ru, TiN, and TaN. The process of forming the second metal Layer 308 can be a physical vapor deposition or a chemical vapor deposition.

The second metal layer 308 can be used for forming a portion of the second electrode plate of the MIM capacitor. The second metal layer 308 can also be used for preventing the metal in the third metal layer 309 from diffusing into the dielectric material layer 307. Thus, the dielectric constant of the dielectric material layer 307 can be intact, and the capacitance of the MIM capacitor can be maintained stable.

The material of the third metal layer 309 can include, for example, copper, tungsten, and/or aluminum. The forming process of the third metal layer 309 can be electroplating or deposition. The third metal layer 309 and the second metal layer 308 together can form the second electrode plate of the MIM capacitor.

In Step S1209 of FIG. 12 and referring to FIG. 10, the third metal layer 309, the second metal layer 308, and the dielectric material layer 307 are chemical mechanical polished, using the surface of the dielectric layer 302 as stop layer. The third metal layer 309 and the second metal layer 308 remaining in the groove can serve as the second electrode plate of the MIM capacitor. The dielectric material layer 307 remaining in the groove can serve as the dielectric layer of the MIM capacitor.

After the second electrode plate is formed, the surface of the second electrode plate is leveled with the surface of the dielectric layer 302. The surface of the second electrode plate is not in the same plane with the surface of the first electrode plate. The top surfaces of the first electrode plate 305 (on the sidewall of the groove 304) and the second metal layer 308 can be spaced apart having a horizontal distance d (e.g., parallel to the surface of the substrate 300) and a vertical height c (e.g., normal to the surface of the substrate 300). For example, the horizontal distance d between the first metal layer and the second metal layer can include at least a thickness of the dielectric material layer 307.

When operating voltages are applied to the first electrode plate and the second electrode plate, because of the horizontal distance d and the vertical height c between the top surfaces of the first and second electrode plates, the possibility of generating leakage current between the first and second electrode plates can be reduced. The leakage current generated between the first and second electrode plates can be sufficiently low. Thereby the operating stability of the MIM capacitor can be improved.

The vertical height c from the top surface of the first electrode plate 305 to the top surface of the dielectric layer 302 (or the second electrode plate) can range from about 50 angstroms to about 2000 angstroms.

In Step S1210 of FIG. 12 and referring to FIG. 11, after the exemplary chemical mechanical polishing, a diffusion barrier layer 310 is formed on the surface of the second electrode plate (e.g., including the remaining third metal layer 309 and second metal layer 308). In addition, a second dielectric layer (not shown) can be formed on the dielectric layer 302 and the diffusion barrier layer 310.

The diffusion barrier layer 310 can prevent metal material of the third metal layer 309 from diffusing from the surface of the second electrode plate into the dielectric layer 302 and into the second dielectric layer (not shown). Thus, the electrical isolation characteristics of the dielectric layers can be maintained, and the stability of semiconductor devices can be improved. The material of the diffusion barrier layer 310 can be CoWP, CuSiAl, CuAl, CuAlN and/or CuMn.

In this manner, the MIM capacitor formed by the disclosed method shown in FIG. 11 can include: a substrate 300, an etch stop layer 301, a dielectric layer 302, a groove 304, a first metal layer 305, a dielectric material layer 307, and/or a second metal layer 308. The substrate 300 can include a conductive layer 303. The etch stop layer 301 can be formed on the substrate 300. The dielectric layer 302 can be formed on the etch stop layer 301. The groove 304 can be formed through the dielectric layer 302 and through the etch stop layer 301 to expose a surface of the conductive layer 303. The first metal layer 305 can be formed on the bottom and a portion of the sidewall of the groove 304. The first metal layer 305 can serve as the first electrode plate of the MIM capacitor and a top of the first metal layer 305 can be lower than the surface of the dielectric layer 302. The dielectric material layer 307 can be located on the first metal layer 305 and on a portion of the sidewall of the groove 304. The dielectric material layer 307 can serve as the dielectric layer of the MIM capacitor. The second metal layer 308 can be located on the surface of the dielectric material layer 307, and the third metal layer 309 can be located on the second metal layer 308. The third metal layer 309 can fill the groove 304. The second metal layer 308 and the third metal layer 309 can form the second electrode plate of the MIM capacitor.

In an exemplary embodiment, the vertical height c from the top of the first metal layer 305 on the sidewall of the groove to the surface of the dielectric layer 302 ranges from about 50 angstroms to about 2000 angstroms. Thus, distances between the top surface of the first and second electrode plates can be optimum. The leakage current between the first and second electrode plates can reach minimum. Furthermore, areas of the first and second electrode plates that face against each other can be less reduced to provide the MIM capacitor with less reduced capacitance.

A diffusion barrier layer can be formed on the surface of the third metal layer 309 and the second metal layer 308. The material of the diffusion barrier layer 310 can be CoWP, CuSiAl, CuAl, CuAlN and/or CuMn.

As such, after a first metal layer is formed on a portion of a sidewall surface and bottom surface of a groove and on the surface of a dielectric layer, a sacrificial layer is formed on the first metal layer. A portion of the sacrificial layer is then removed from the surface of the dielectric layer and from a portion of the thickness of the sidewall of the groove by an etch-back process, to expose a portion of the first metal layer on the dielectric layer (e.g., including the first metal layer on the sidewall of the groove of the dielectric layer). The exposed portion of the first metal layer is then removed, by etching, from the top surface of the dielectric layer and from the sidewall surface of the groove in the dielectric layer. The remaining portion of the first metal layer in the groove can serve as the first electrode plate of the MIM capacitor. Thus, the surface of the first metal layer on the sidewall of the groove can be lower than the top surface of the dielectric layer, while the process steps can remain simple.

Further, a thickness of the etched portion of the sacrificial layer in the groove can be about 5% to about 30% relative to the entire depth of the groove. The distance can reach optimum between the top surfaces of the subsequently formed first and second electrode plates. The leakage current between the first and second electrode plates can be sufficiently reduced. Areas of the first and second electrode plates that face against each other can be less reduced to provide the MIM capacitor with less reduced capacitance.

Furthermore, the material of the second metal layer can be one or more of Ti, Ta, Ru, TiN and/or TaN. The second metal layer can be used for forming a portion of the second electrode plate of the MIM capacitor. In addition, the second metal layer can also be used for preventing the metal material in the third metal layer from diffusing into the dielectric material layer. The dielectric constant of the dielectric material layer can remain unaffected. The capacitance of the MIM capacitor can be maintained stable.

As disclosed, the top surface of the first electrode plate on the sidewall of the groove can be lower than the surface of the dielectric layer. And the top surface of the second metal layer and the third metal layer can be leveled with the surface of the dielectric layer. That is, the top surface of the first electrode plate on the sidewall of the groove can be lower than the surface of the second electrode plate (formed by the second metal layer and the third metal layer). The top surfaces of the first electrode plate (on the sidewall of the groove) and the second metal layer can include a horizontal distance and a vertical height. When operating voltages are applied to the first and second electrode plates and because the top surfaces of the first and second electrode plates are increased, the possibility of generating a leakage current between the first and second electrode plates can be reduced. The leakage current generated between the first and second electrode plates can be reduced. Thereby the operating stability of the MIM capacitor can be improved.

In addition, the vertical height from the top surface of the first metal layer on the sidewall of the groove to the top surface of the dielectric layer ranges from about 50 angstroms to about 2000 angstroms. Thus, the distance between the top surface of the first and second electrode plates can be optimum. The leakage current between the first and second electrode plates can reach minimum. Areas of the first and second electrode plates that face against each other can be less reduced to provide the MIM capacitor with less reduced capacitance.

Further, a diffusion barrier layer can be formed on surface of the second electrode plate (e.g., including the remaining third metal layer and second metal layer). The diffusion barrier layer can prevent the metal material of the third metal layer from diffusing from the surface of the second electrode plate into the dielectric layer and into the second dielectric layer. Thus, the electrical isolation characteristics of the dielectric layers can be maintained, and the stability of semiconductor devices can be improved.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A method for forming an MIM capacitor, comprising:
    forming a dielectric layer over a substrate containing a conductive layer;
    forming a groove through the dielectric layer to expose the conductive layer in the substrate;
    forming a first metal layer on a sidewall surface and a bottom surface of the groove and on a top surface of the dielectric layer;
    forming a sacrificial layer in the groove to expose a portion of the first metal layer that is on the top surface of the dielectric layer and on a top portion of the sidewall surface of the groove;
    removing the exposed portion of the first metal layer to leave a remaining portion thereof in the groove as a first electrode plate of the MIM capacitor;
    removing the sacrificial layer from the groove to leave the first electrode plate remaining in the groove;
    forming a dielectric material layer on the first electrode plate, on the top portion of the sidewall surface of the groove, and on the top surface of the dielectric layer;
    forming a second metal layer on the dielectric material layer;
    forming a third metal layer on the second metal layer to fill the groove in the dielectric layer; and
    polishing the third metal layer, the second metal layer, and the dielectric material layer, using the top surface of the dielectric layer as a stop layer to expose a tip surface area of the dielectric material layer and to expose a tip surface area of the second metal layer; and
    forming a diffusion barrier layer on the third metal layer in the groove, wherein:

the diffusion barrier layer is made of a material including one or more selected from the group consisting of CoWP, CuSiAl, CuAl, CuAlN, and CuMn, and
the diffusion barrier layer is patterned so as to cover the tip surface area of the second metal layer and to expose a main portion of the tip surface area of the dielectric material layer.

2. The method of claim 1, wherein, after polishing, a remaining portion of the second metal layer and the third metal layer in the groove serves as a second electrode plate of the MIM capacitor, and a remaining portion of the dielectric material layer in the groove serves as a dielectric layer of the MIM capacitor.

3. The method of claim 1, wherein the forming of the sacrificial layer in the groove comprises:
    forming a sacrificial material layer on the first metal layer to fill the groove;
    removing a portion of the sacrificial material layer from the top surface of the dielectric layer and from the groove, to expose the portion of the first metal layer on the top surface of the dielectric layer and on the top portion of the sidewall surface of the groove, and to leave the sacrificial layer in the groove.

4. The method of claim 3, wherein the removed portion of the sacrificial material layer has a thickness ranging from about 5% to about 30% of a total depth of the groove.

5. The method of claim 3, wherein a total depth of the groove ranges from about 1000 angstroms to about 10000 angstroms, and the removed portion of the sacrificial material layer has a thickness ranging from about 100 angstroms to about 2000 angstroms.

6. The method of claim 1, wherein the sacrificial layer is made of a material including one or more selected from the group consisting of a bottom anti-reflective coating, an amorphous carbon, a polymer, an amorphous silicon, and a polysilicon.

7. The method of claim 1, wherein the first metal layer is made of a material including one or more of Ti, Ta, Ru, TiN, and TaN.

8. The method of claim 1, wherein the removing of the exposed portion of the first metal layer includes a plasma etching or a wet etching.

9. The method of claim 1, wherein the second metal layer and the first metal layer are made of a same material including one or more of Ti, Ta, Ru, TiN, and TaN.

10. The method of claim 1, wherein the dielectric material layer has a dielectric constant ranging from about 5 to about 200, and a thickness ranging from about 10 angstroms to about 200 angstroms.

11. The method of claim 1, wherein the dielectric material layer is a high-K dielectric material.

12. The method of claim 11, wherein the high-K dielectric material includes one or more selected from the group consisting of $HfO_2$, $TiO_2$, HfZrO, HfSiNO, $Ta_2O_5$, $ZrO_2$, $ZrSiO_2$, $Al_2O_3$, $SrTiO_3$, and BaSrTiO.

13. The method of claim 1, wherein a vertical height from a top surface of the first electrode plate to the top surface of the dielectric layer ranges from about 50 angstroms to about 2000 angstroms.

14. The method of claim 1, wherein a horizontal distance between the first electrode plate and the second metal layer includes at least a thickness of the dielectric material layer.

15. The method of claim 1, further including forming an etch stop layer between the substrate and the dielectric layer.

* * * * *